US012753109B2

(12) United States Patent
Kim et al.

(10) Patent No.: US 12,753,109 B2
(45) Date of Patent: Oct. 6, 2026

(54) GLASS COMPOSITION, GLASS ARTICLE PREPARED THEREFROM, AND DISPLAY DEVICE

(71) Applicants: Samsung Display Co., LTD., Yongin-si (KR); Kongju National University Industry-University Cooperation Foundation, Gongju-si (KR)

(72) Inventors: Seung Kim, Yongin-si (KR); Woon Jun Chung, Seongnam-si (KR); Kyeong Dae Park, Cheonan-si (KR); Min Gyeong Kang, Cheonan-si (KR); Seung Ho Kim, Yongin-si (KR); Seong Young Park, Cheonan-si (KR); Cheol Min Park, Yongin-si (KR); Hui Yeon Shon, Yongin-si (KR); Gyu In Shim, Yongin-si (KR); Jae Gil Lee, Yongin-si (KR); Jin Won Jang, Yongin-si (KR); So Mi Jung, Yongin-si (KR)

(73) Assignees: SAMSUNG DISPLAY CO., LTD., Gyeonggi-Do (KR); KONGJU NATIONAL UNIVERSITY INDUSTRY-UNIVERSITY COOPERATION FOUNDATION, Gongju-si (KR)

( * ) Notice: Subject to any disclaimer, the term of this patent is extended or adjusted under 35 U.S.C. 154(b) by 704 days.

(21) Appl. No.: 18/094,966

(22) Filed: Jan. 9, 2023

(65) Prior Publication Data

US 2023/0303423 A1 Sep. 28, 2023

(30) Foreign Application Priority Data

Mar. 18, 2022 (KR) ........................ 10-2022-0034264
Aug. 9, 2022 (KR) ........................ 10-2022-0099294

(51) Int. Cl.
*C03C 3/085* (2006.01)
*C03C 3/091* (2006.01)
(Continued)

(52) U.S. Cl.
CPC .............. *C03C 3/085* (2013.01); *C03C 3/091* (2013.01); *C03C 3/097* (2013.01); *H05K 5/03* (2013.01)

(58) Field of Classification Search
None
See application file for complete search history.

(56) References Cited

U.S. PATENT DOCUMENTS 8,273,262 B2 9/2012 Saijo et al.
9,898,046 B2 2/2018 Chang et al.
(Continued)

FOREIGN PATENT DOCUMENTS

CN 111533447 8/2020
JP 6195941 8/2017
(Continued)

OTHER PUBLICATIONS

Extended European Search Report—European Application No. EP 23162298.6 dated Aug. 18, 2023, citing references listed within.

*Primary Examiner* — Laura C Powers
(74) *Attorney, Agent, or Firm* — CANTOR COLBURN LLP

(57) ABSTRACT

A glass article having a glass composition including about 60 mol % to about 70 mol % of $SiO_2$, about 5 mol % to about 15 mol % of $Al_2O_3$, about 5 mol % to about 15 mol % of $Na_2O$, about 5 mol % to about 15 mol % of $Li_2O$, about 0 mol % to about 5 mol % of MgO, and about 0 mol % to about 5 mol % of $ZrO_2$ based on a total weight of the glass composition, where a thickness of the glass article is in a range of about 20 μm to about 100 μm, and the glass
(Continued)

composition satisfies the following Relational Expression: $0.3<Al_2O_3/(Na_2O+Li_2O)\leq 1$, in which $Al_2O_3$, $Na_2O$, and $Li_2O$ denote contents (mol %) of respective components in the glass composition.

23 Claims, 9 Drawing Sheets

(51) Int. Cl.
*C03C 3/097* (2006.01)
*H05K 5/03* (2006.01)

(56) References Cited

U.S. PATENT DOCUMENTS

| | | | |
|---|---|---|---|
| 10,071,933 | B2 | 9/2018 | Wang et al. |
| 10,261,545 | B2 | 4/2019 | Kim et al. |
| 10,665,816 | B2 | 5/2020 | Oh et al. |
| 10,732,445 | B2 | 8/2020 | Shin et al. |
| 10,817,016 | B2 | 10/2020 | Kim et al. |
| 11,639,308 | B2 | 5/2023 | Imakita et al. |
| 11,760,688 | B2 | 9/2023 | Lee |
| 12,297,142 | B2 | 5/2025 | Imakita et al. |
| 2013/0330515 | A1 | 12/2013 | Oh et al. |
| 2017/0341973 | A1 | 11/2017 | Gross et al. |
| 2018/0297892 | A1 | 10/2018 | Lee et al. |
| 2019/0348629 | A1 | 11/2019 | Hu |
| 2020/0317558 | A1 | 10/2020 | Yuki et al. |
| 2021/0178730 | A1 | 6/2021 | Baby et al. |
| 2023/0049035 | A1 | 2/2023 | Yuki et al. |
| 2023/0234885 | A1 | 7/2023 | Imakita et al. |
| 2023/0382788 | A1 | 11/2023 | Lee |
| 2025/0257004 | A1 | 8/2025 | Imakita et al. |

FOREIGN PATENT DOCUMENTS

| | | | |
|---|---|---|---|
| KR | 20100087168 | A | 8/2010 |
| KR | 1020150129732 | | 11/2015 |
| KR | 1020150140570 | | 12/2015 |
| KR | 101620375 | | 5/2016 |
| KR | 101661278 | | 9/2016 |
| KR | 101684344 | | 12/2016 |
| KR | 1020170130498 | | 11/2017 |
| KR | 101825276 | | 2/2018 |
| KR | 1020180020110 | | 2/2018 |
| KR | 101902597 | | 9/2018 |
| KR | 1020180136490 | | 12/2018 |
| KR | 1020190012143 | | 2/2019 |
| KR | 101972444 | | 4/2019 |
| KR | 1020190099233 | | 8/2019 |
| KR | 102022450 | | 9/2019 |
| KR | 1020190113532 | | 10/2019 |
| KR | 102041441 | | 11/2019 |
| KR | 20200102979 | A | 9/2020 |
| KR | 20210088040 | A | 7/2021 |
| KR | 1020210106515 | | 8/2021 |
| KR | 102354231 | | 1/2022 |
| WO | 2018152845 | A1 | 8/2018 |
| WO | 2019004124 | A1 | 1/2019 |
| WO | 2019218155 | A1 | 11/2019 |
| WO | 2019242673 | A1 | 12/2019 |
| WO | 2020227924 | A1 | 11/2020 |

GLASS COMPOSITION, GLASS ARTICLE PREPARED THEREFROM, AND DISPLAY DEVICE

This application claims priority to Korean Patent Application No. 10-2022-0034264, filed on Mar. 18, 2022, and Korean Patent Application No. 10-2022-0099294, filed on Aug. 9, 2022, and all the benefits accruing therefrom under 35 U.S.C. § 119, the contents of which in their entireties are herein incorporated by reference.

BACKGROUND

1. Field

The disclosure relates to a glass composition, a glass article prepared therefrom, and a display device including the glass article.

2. Description of the Related Art

Glass articles are widely used in electronic devices including display devices, building materials, and the like. For example, glass articles are applied to substrates of flat panel display devices such as liquid crystal display devices (LCDs), organic light emitting display devices (OLEDs), and electrophoretic display devices, cover windows for protecting the flat panel display devices, or the like.

As portable electronic devices such as smartphones and tablet personal computers (PCs) are widely used in recent, glass articles applied to the portable electronic devices are also frequently exposed to an external shock. The development of glass articles capable of withstanding an external shock while being thin for portability has been desired.

SUMMARY

Recently, for convenience of a user, foldable display devices have been studied. The glass article applied to the foldable display device preferably has a strength capable of withstanding an external shock while having a small thickness to relieve bending stress when being folded. Accordingly, there is an attempt to improve a strength of a thin glass article by changing a component ratio and a preparation process condition of a composition of the glass article.

Embodiments of the disclosure provide a glass composition having a novel composition ratio, a glass article prepared therefrom, and a display device including the glass article.

According to an embodiment of the disclosure, a glass article has a glass composition including about 60 mole percent (mol %) to about 70 mol % of $SiO_2$, about 5 mol % to about 15 mol % of $Al_2O_3$, about 5 mol % to about 15 mol % of $Na_2O$, about 5 mol % to about 15 mol % of $Li_2O$, about 0 mol % to about 5 mol % of MgO, and about 0 mol % to about 5 mol % of $ZrO_2$ based on a total weight of the glass composition, where a thickness of the glass article is in a range of about 20 micrometers (μm) to about 100 μm, and the glass composition satisfies the following Relational Expression: $0.3<Al_2O_3/(Na_2O+Li_2O)\leq 1$, in which $Al_2O_3$, $Na_2O$, and $Li_2O$ denote contents (mol %) of respective components in the glass composition.

In an embodiment, the glass composition may further include about 0 mol % to about 5 mol % of $P_2O_5$.

In an embodiment, an etch rate (ER) of the glass article for a fluorine-based etchant may be in a range of about 1 micrometer per minutes (μm/min) to about 4 μm/min.

In an embodiment, a glass transition temperature of the glass article may be in a range of about 500° C. to about 700° C.

In an embodiment, a density of the glass article may be in a range of about 2.4 grams per cubic centimeter (g/cm$^3$) to about 2.5 g/cm$^3$.

In an embodiment, an elastic modulus of the glass article may be in a range of about 75 gigapascals (GPa) to about 85 GPa.

In an embodiment, a hardness of the glass may be is in a range of about 6.0 GPa to about 7.0 GPa.

In an embodiment, a fracture toughness of the glass article may be in a range of about 1.0 megapascal square root meter (MPa·m$^{0.5}$) to about 1.5 MPa·m$^{0.5}$.

In an embodiment, a brittleness of the glass article may be in a range of about 4.5 per square root micrometer (μm$^{-0.5}$) to about 6 μm$^{-0.5}$.

In an embodiment, a coefficient of thermal expansion of the glass article may be in a range of about $70\times10^{-7}$ per kelvin (K$^{-1}$) to about $85\times10^{-7}$ K$^{-1}$.

In an embodiment, a Poisson ratio of the glass article may be in a range of about 0.18 to about 0.22.

In an embodiment, an average value of limit drop heights of pen drop damage may be about 4.5 cm or more.

According to an embodiment of the disclosure, a glass composition includes about 60 mol % to about 70 mol % of $SiO_2$, about 5 mol % to about 15 mol % of $Al_2O_3$, about 5 mol % to about 15 mol % of $Na_2O$, about 5 mol % to about 15 mol % of $Li_2O$, about 0 mol % to about 5 mol % of MgO, and about 0 mol % to about 5 mol % of $ZrO_2$ based on a total weight of the glass composition, where the glass composition satisfies the following Relational Expression: $0.3<Al_2O_3/(Na_2O+Li_2O)\leq 1$, in which $Al_2O_3$, $Na_2O$, and $Li_2O$ denote contents (mol %) of respective components in the glass composition.

In an embodiment, the glass composition may further include about 0 mol % to about 5 mol % of $P_2O_5$.

In an embodiment, the glass composition may not include $R_2O$ (R═K) other than $Na_2O$ and $Li_2O$.

According to an embodiment of the disclosure, a display device includes a display panel including a plurality of pixels, a cover window disposed above the display panel, and an optical clear coupling layer disposed between the display panel and the cover window, where the cover window has a glass composition including about 60 mol % to about 70 mol % of $SiO_2$, about 5 mol % to about 15 mol % of $Al_2O_3$, about 5 mol % to about 15 mol % of $Na_2O$, about 5 to about 15 mol % of $Li_2O$, about 0 mol % to about 5 mol % of MgO, and about 0 mol % to about 5 mol % of $ZrO_2$ based on a total weight of the glass composition, where the cover window has a thickness in a range of about 20 μm to about 100 μm, and the glass composition satisfies the following Relational Expression: $0.3<Al_2O_3/(Na_2O+Li_2O)\leq 1$, in which $Al_2O_3$, $Na_2O$, and $Li_2O$ denotes contents (mol %) of respective components in the glass composition.

In an embodiment, the glass composition may further include about 0 mol % to about 5 mol % of $P_2O_5$.

In an embodiment, the glass composition may not include $R_2O$ (R=K) other than $Na_2O$ and $Li_2O$.

In an embodiment, a glass transition temperature of the cover window may be in a range of about 500° C. to about 700° C.

In an embodiment, a density of the cover window may be in a range of about 2.4 g/cm$^3$ to about 2.5 g/cm$^3$.

In an embodiment, an elastic modulus of the cover window may be in a range of about 75 GPa to about 85 GPa.

In an embodiment, a hardness of the cover window may be in a range of about 6.0 GPa to about 7.0 GPa.

In an embodiment, a fracture toughness of the cover window may be in a range of about 1.0 $MPa\cdot m^{0.5}$ to about 1.5 $MPa\cdot m^{o}$.

In an embodiment, a brittleness of the cover window may be in a range of about 4.5 $\mu m^{-0.5}$ to about 6 $\mu m^{-0.5}$.

In an embodiment, a coefficient of thermal expansion of the cover window may be in a range of about $70\times10^{-7}$ $K^{-1}$ to about $85\times10^{-7}$ $K^{-1}$.

In an embodiment, a Poisson ratio of the cover window may be in a range of about 0.18 to about 0.22.

In a glass composition according to embodiments, respective components may include composition ratios in predetermined ranges, and a glass article prepared from the glass composition may have improved mechanical strength, surface strength, and shock resistance properties while having flexibility. In such embodiments, the glass article may have high processability, and may have high flexibility and improved strength effectively applicable to a foldable display device.

The effects of the disclosure are not limited to the aforementioned effects, and various other effects are included in the specification.

BRIEF DESCRIPTION OF THE DRAWINGS

The above and other features of embodiments of the disclosure will become more apparent by describing in detail embodiments thereof with reference to the accompanying drawings, in which.

DETAILED DESCRIPTION

Figure 1:
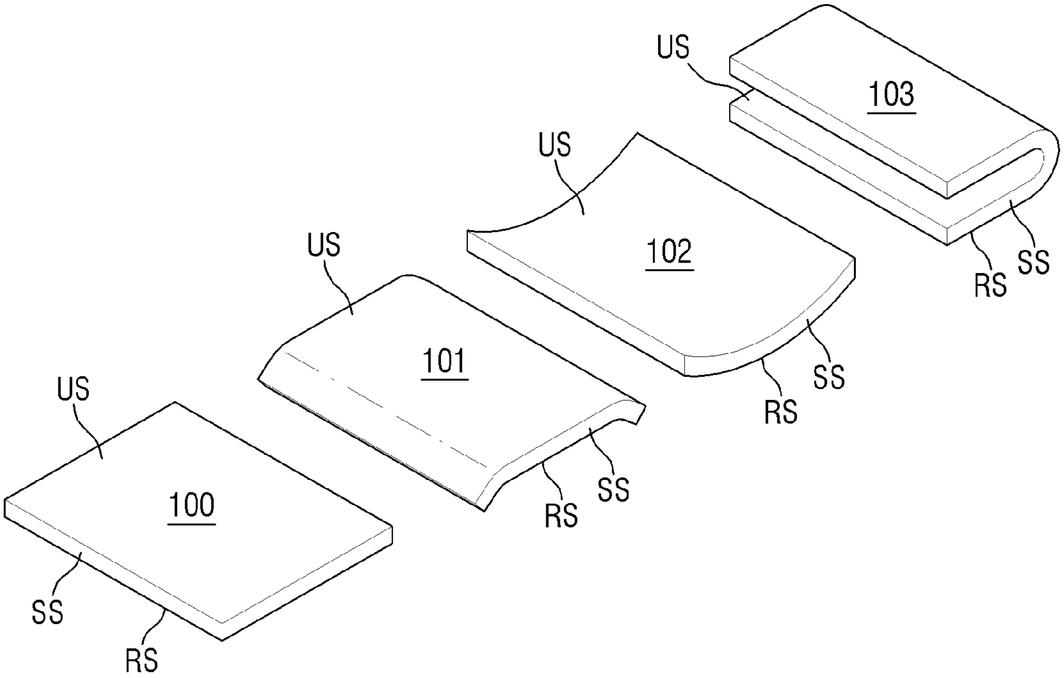
FIG. 1 is perspective views of glass articles in accordance with various embodiments.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is perspective views of glass articles in accordance with various embodiments.

A glass (or a glass article) may be used as a cover window for protecting a display, a substrate for a display panel, a substrate for a touch panel, an optical member such as a light guide plate, and the like, in electronic devices including displays, such as refrigerators and washing machines including display screens, as well as tablet personal computer (PCs), laptop computers, smartphones, electronic books, televisions, PC monitors. The glass may also be used as a cover glass of instrument boards of vehicles, a cover glass for solar cells, an interior material of building materials, a window of buildings or houses, and the like.

A glass is desired to have a high strength. For example, a glass for a window may be desired to have a strength enough to be not easily damaged by an external shock while having a small thickness to satisfy requirements of high transmissivity and a light weight.

A glass of which a strength is increased may be prepared by a method such as chemical strengthening or thermal strengthening. Examples of various shapes of strengthened glasses are illustrated in FIG. 1.

Referring to FIG. 1, in an embodiment, a glass article 100 may have a flat panel sheet or flat panel plate shape. In an alternative embodiment, a glass article 101, 102 or 103 may have a three-dimensional shape including a curved portion. In an embodiment, for example, edges of a flat portion of the glass article may be curved (see the glass article 101 in FIG. 1), or the glass article may be overall curved (see the glass article 102 in FIG. 1) or be folded (see the glass article 103 in FIG. 1). Alternatively, the glass article 100 may have a flat panel sheet or flat panel plate shape, but may have flexibility and be folded, stretched, or rolled.

Each of the glass articles 100 to 103 may have a rectangular shape in a plan view, but is not limited thereto, and may have various shapes such as a rectangular shape with rounded corners, a square shape, a circular shape, and an elliptical shape. Hereinafter, by way of example, embodiments where the glass article is a flat panel plate having a rectangular shape in a plan view will be described in detail for convenience of description, but is not limited thereto.

Figure 2:
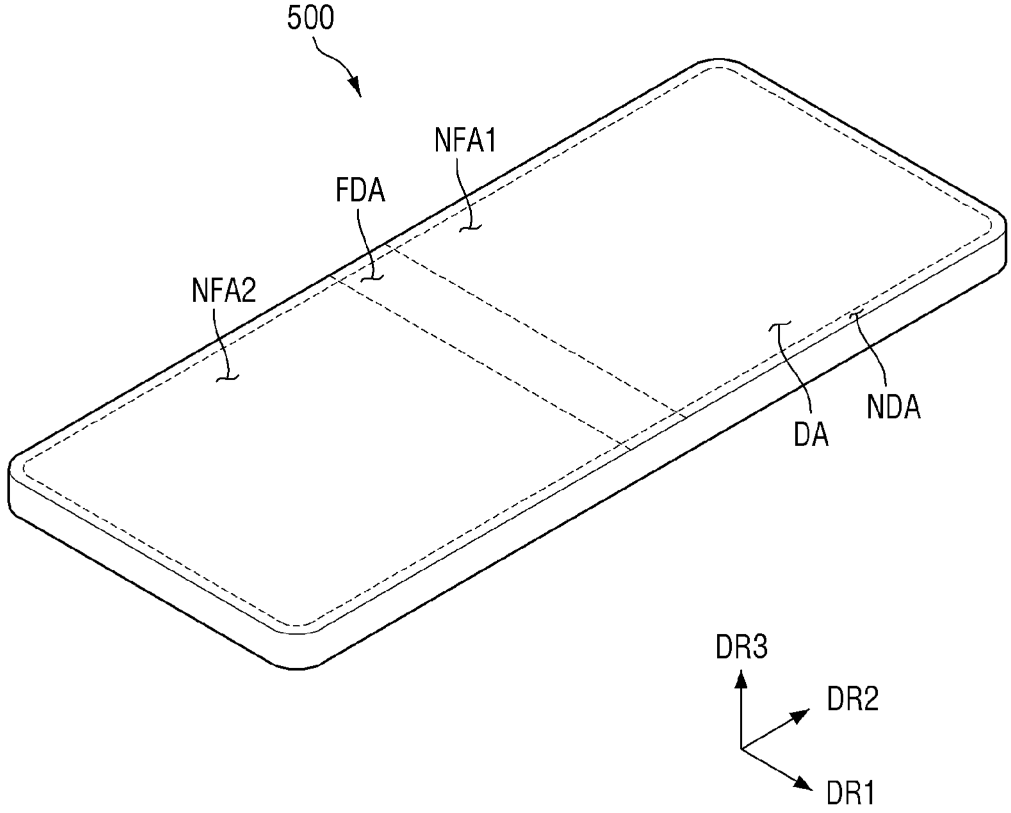
FIG. 2 is a perspective view illustrating a display device in an unfolded state to which a glass article according to an embodiment is applied.
Figure 3:
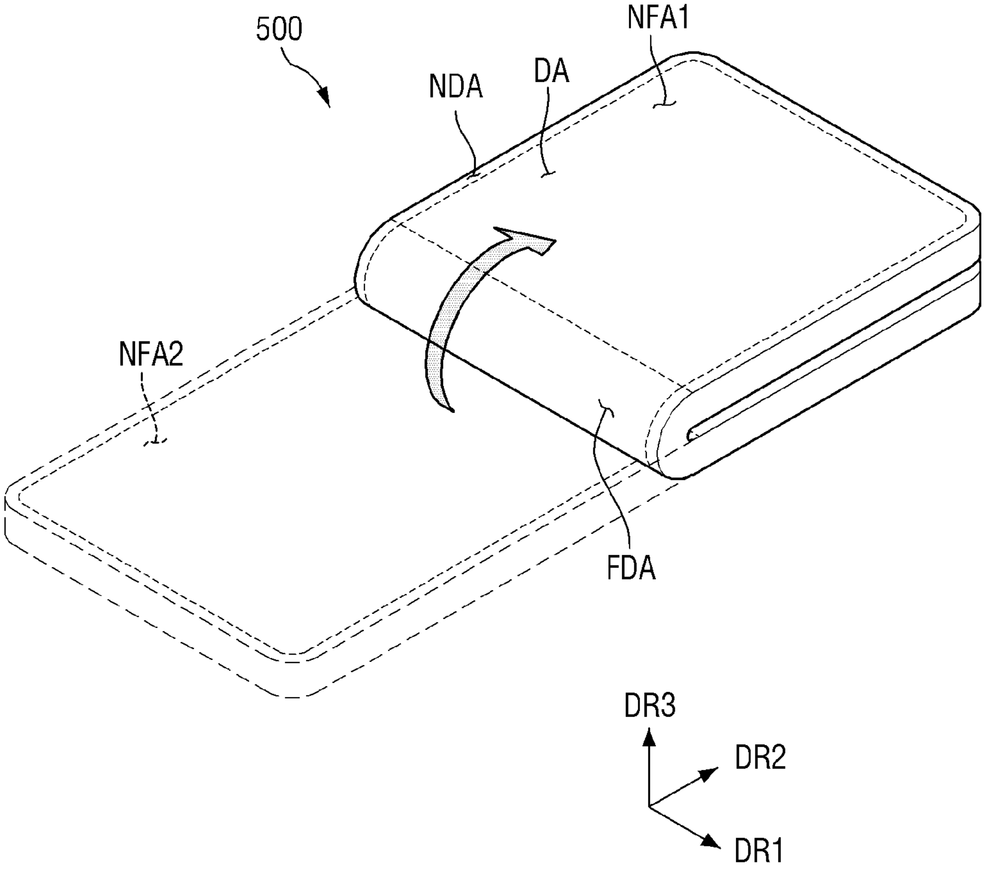
FIG. 3 is a perspective view illustrating the display device of FIG. 2 in a folded state.

FIG. 2 is a perspective view illustrating a display device in an unfolded state to which a glass article according to an embodiment is applied. FIG. 3 is a perspective view illustrating the display device of FIG. 2 in a folded state.

Referring to FIGS. 2 and 3, a display device 500 according to an embodiment may be a foldable display device. As described later, in an embodiment of the display device 500, the glass article 100 of FIG. 1 may be applied as a cover window, and the glass article 100 may have flexibility and be foldable.

In FIGS. 2 and 3, a first direction DR1 may be a direction parallel to one side of the display device 500 in a plan view, and may be, for example, a transverse direction of the display device 500. A second direction DR2 is a direction parallel to the other side of the display device 500 in contact with one side of the display device 500 in a plan view, and may be a longitudinal direction of the display device 500. A third direction DR3 may be a thickness direction of the display device 500.

In an embodiment, the display device 500 may have a rectangular shape in a plan view. The display device 500 may have a rectangular shape with vertical corners or a rectangular shape with rounded corners in a plan view. The display device 500 may include two short sides extending in the first direction DR1 and two long sides extending in the second direction DR2 in a plan view.

The display device 500 includes a display area DA and a non-display area NDA. In a plan view, a shape of the display area DA may correspond to the shape of the display device 500. In an embodiment, for example, where the display device 500 has a rectangular shape in a plan view, the display area DA may also have a rectangular shape.

The display area DA may be an area for displaying an image by including a plurality of pixels therein. The plurality of pixels may be arranged in a matrix direction. The plurality of pixels may have a rectangular shape, a rhombic shape, or a square shape in a plan view, but are not limited thereto. In an embodiment, for example, the plurality of pixels may have a quadrangular shape other than the rectangular shape, the rhombic shape, or the square shape, a polygonal shape other than a quadrangular shape, a circular shape, or an elliptical shape in a plan view.

The non-display area NDA may be an area that does not display an image because no pixel is included therein. The non-display area NDA may be disposed around the display area DA. The non-display area NDA may be disposed to surround the display area DA, but is not limited thereto. The display area DA may be partially surrounded by the non-display area NDA.

In an embodiment, the display device 500 may be maintained in both a folded state and an unfolded state. The display device 500 may be folded in an in-folding manner in which the display area DA is disposed inside as illustrated in FIG. 3. In an embodiment When the display device 500 is folded in the in-folding manner, upper surfaces of the display device 500 may be disposed to face each other. In an alternative embodiment, for example, the display device 500 may be folded in an out-folding manner in which the display area DA is disposed outside. When the display device 500 is folded in the out-folding manner, lower surfaces of the display device 500 may be disposed to face each other.

In an embodiment, the display device 500 may be a foldable device. The term "foldable device" as used herein is a device that may be folded, and is used as the meaning including not only a folded device, but also a device that may have both a folded state and an unfolded state. In addition, folding typically includes folding at an angle of about 180°, but is not limited thereto, and when a folding angle exceeds 1800 or is less than 180°, for example, 900 or more and less than 1800 or 1200 or more and less than 180°, it may be understood that the display device is folded. In addition, when the display device is in a bent state out of an unfolded state even though it is not completely folded, it may be referred to as the folded state. For example, even though the display device is bent at an angle of 900 or less, as long as a maximum folding angle is 900 or more, it may be expressed that the display device is in the folded state to be distinguished from the unfolded state. A radius of curvature of the display device when being folded may be about 5 mm or less, may be in the range of about 1 mm to about 2 mm or may be about 1.5 mm, but is not limited thereto.

In an embodiment, the display device 500 may include a folding area FDA, a first non-folding area NFA1, and a second non-folding area NFA2. The folding area FDA may be an area in which the display device 500 is folded, and the first non-folding area NFA1 and the second non-folding area NFA2 may be areas in which the display device 500 is not folded.

The first non-folding area NFA1 may be disposed on one side, for example, the upper side of the folding area FDA. The second non-folding area NFA2 may be disposed on an opposing side, for example, the lower side of the folding area FDA. The folding area FDA may be an area curved with a predetermined curvature.

In an embodiment, the folding area FDA of the display device 500 may be determined at a specific position. The number of folding areas FDA determined at a specific position in the display device 500 may be one or two or more. In an alternative embodiment, a position of the folding area FDA is not specified in the display device 500, and may be freely set in various areas.

In an embodiment, the display device 500 may be folded in the second direction DR2. Accordingly, a length of the display device 500 in the second direction DR2 may be reduced by approximately half, and thus, a user may conveniently carry the display device 500.

In an embodiment, a direction in which the display device 500 is folded is not limited to the second direction DR2. In an embodiment, for example, the display device 500 may be folded in the first direction DR1. In such an embodiment, a length of the display device 500 in the first direction DR1 may be reduced by approximately half.

FIGS. 2 and 3 illustrate an embodiment where each of the display area DA and the non-display area NDA overlaps the folding area FDA, the first non-folding area NFA1, and the second non-folding area NFA2, but the disclosure is not limited thereto. In an embodiment, for example, each of the display area DA and the non-display area NDA may overlap at least one of the folding area FDA, the first non-folding area NFA1, and the second non-folding area NFA2.

Figure 4:
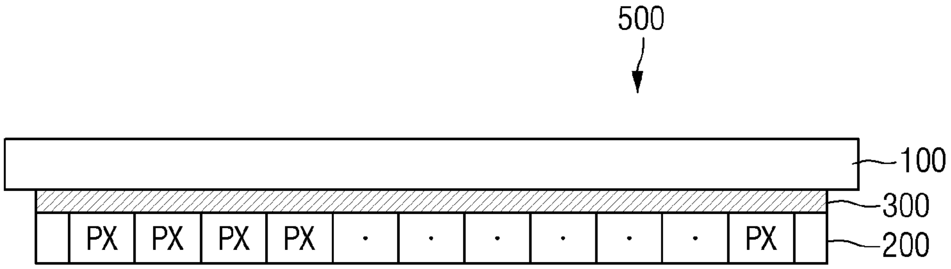
FIG. 4 is a cross-sectional view illustrating a display device in which the glass article according to an embodiment is applied as a cover window of the display device.

FIG. 4 is a cross-sectional view illustrating a display device in which the glass article according to an embodiment is applied as a cover window of the display device.

Referring to FIG. 4, an embodiment the display device 500 may include a display panel 200, the glass article 100 disposed on the display panel 200 and serving as a cover window, and an optical (or optically) clear coupling layer 300 disposed between the display panel 200 and the glass article 100 and coupling the display panel 200 and the glass article 100 to each other.

The display panel 200 may be, for example, not only a self-light emitting display panel such as an organic light emitting display (OLED) panel, an inorganic light emitting (inorganic EL) display panel, a quantum dot light emitting display (QED) panel, a micro light emitting diode (LED) display panel, a nano LED display panel, a plasma display panel (PDP), a field emission display (FED) panel, and a cathode ray tube (CRT) display panel, but also a light-receiving display panel such as a liquid crystal display (LCD) panel and an electrophoretic display (EPD) panel.

The display panel 200 may include a plurality of pixels PX, and may display an image using light emitted from each pixel PX. The display device 500 may further include a touch member (not illustrated). In an embodiment, the touch member may be internalized in the display panel 200. In an embodiment, for example, the touch member is directly formed on a display member of the display panel 200, such that the display panel 200 itself may perform a touch function. In an alternative embodiment, the touch member may be prepared separately from the display panel 200 and then attached to an upper surface of the display panel 200 by the optical clear coupling layer.

The glass article 100 for protecting the display panel 200 is disposed above the display panel 200. The glass article 100 has a greater size than the display panel 200, such that side surfaces thereof may protrude outward more than side surfaces of the display panel 200, but the disclosure is not limited thereto. The display device 500 may further include a printing layer (not illustrated) disposed on at least one surface of the glass article 100 at an edge portion of the glass article 100. The printing layer may prevent a bezel area of the display device 500 from being viewed externally, and may also perform a decorative function.

The optical clear coupling layer 300 is disposed between the display panel 200 and the glass article 100. The optical clear coupling layer 300 serves to fix the glass article 100 onto the display panel 200. The optical clear coupling layer 300 may include an optical clear adhesive (OCA), an optical clear resin (OCR), or the like.

Hereinafter, an embodiment of the glass article 100 strengthened as described above will be described in greater detail.

Figure 5:
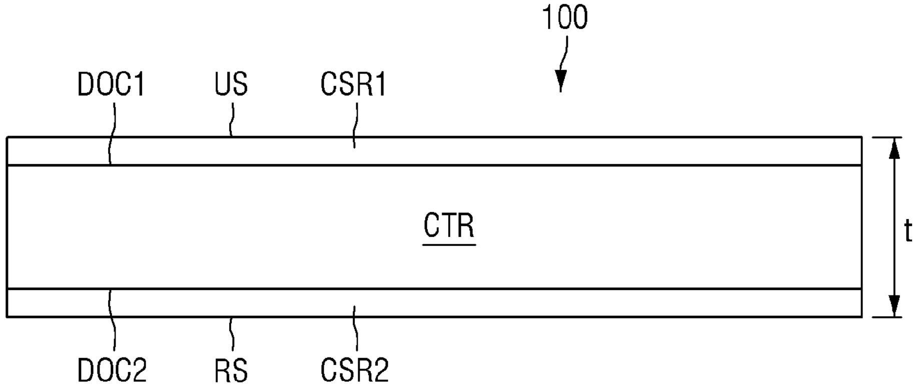
FIG. 5 is a cross-sectional view of a glass article having a flat panel plate shape according to an embodiment.

FIG. 5 is a cross-sectional view of a glass article having a flat panel plate shape according to an embodiment.

Referring to FIG. 5, an embodiment of the glass article 100 may include a first surface US, a second surface RS, and side surfaces. In the glass article 100 having the flat panel plate shape, the first surface US and the second surface RS are main surfaces having a great area, and the side surfaces are outer surfaces connecting the first surface US and the second surface RS to each other.

The first surface US and the second surface RS oppose each other in the thickness direction. When the glass article 100 serves to transmit light like a cover window of a display, the light may mainly enter one of the first surface US and the second surface RS and be then transmitted through the other of the first surface US and the second surface RS.

A thickness t of the glass article 100 is defined as a distance between the first surface US and the second surface RS. In an embodiment, the glass article 100 may be ultra-thin glass. The thickness t of the glass article 100 may be in a range of about 20 micrometers (μm) to about 100 μm, but is not limited thereto. In an embodiment, the thickness t of the glass article 100 may be about 80 μm or less. In an alternative embodiment, the thickness t of the glass article 100 may be about 75 μm or less. In another alternative embodiment, the thickness t of the glass article 100 may be about 70 μm or less. In still another alternative embodiment, the thickness t of the glass article 100 may be about 60 μm or less. In still another alternative embodiment, the thickness t of the glass article 100 may be about 65 Vim or less. In still another alternative embodiment, the thickness t of the glass article 100 may be about 50 μm or less. In still another alternative embodiment, the thickness t of the glass article 100 may be about 30 μm or less. In some embodiments, the thickness t of the glass article 100 may be in a range of about 20 μm to about μm, or may be about 30 μm, for example. The glass article 100 may have a uniform thickness t, but is not limited thereto, and may have a different thickness t for each region.

The glass article 100 may be strengthened to have a predetermined stress profile therein. The occurrence of cracks, propagation of cracks, damage, and the like, due to an external shock are better prevented in the strengthened glass article 100 than in the glass article 100 before being strengthened. The glass article 100 strengthened through a strengthening process may have various stresses for each region. In an embodiment, for example, compressive regions CSR1 and CSR2 in which compressive stresses act may be disposed in the vicinity of surfaces of the glass article 100, that is, in the vicinity of the first surface US and the second surface RS, and a tensile region CTR in which a tensile stress acts may be disposed inside the glass article 100. Stress values of boundaries DOC1 and DOC2 between the compressive regions CSR1 and CSR2 and the tensile region CTR may be 0. A stress value of the compressive stress in one compressive region CSR1 or CSR2 may change depending on a position (i.e., a depth from the surface). In addition, the tensile region CTR may have different stress values depending on a depth from the surface US or RS.

Positions of the compressive regions CSR1 and CSR2, stress profiles within the compressive regions CSR1 and CSR2, compressive energy of the compressive regions CSR1 and CSR2, tensile energy of the tensile region CTR, or the like, within the glass article 100 may have a significant influence on mechanical properties of the glass article 100 such as a surface strength.

Figure 6:
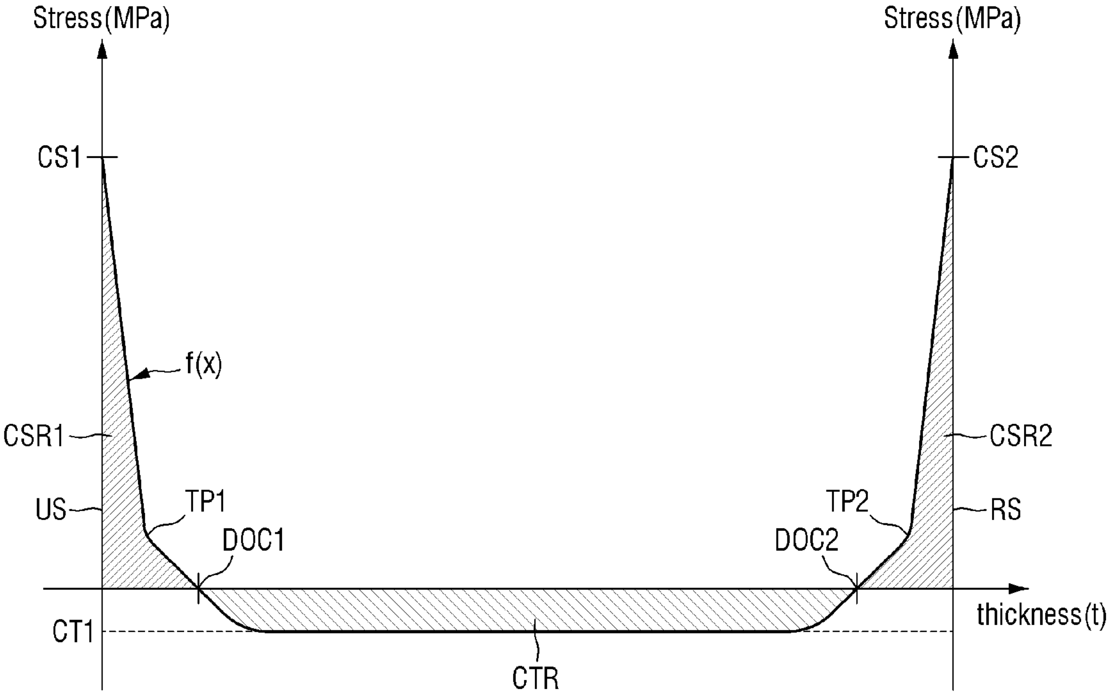
FIG. 6 is a graph illustrating a stress profile of the glass article according to an embodiment.

FIG. 6 is a graph illustrating a stress profile of the glass article according to an embodiment. In the graph of FIG. 6, an x axis indicates the thickness direction of the glass article. In FIG. 6, the compressive stress is expressed as a positive value and the tensile stress is expressed as a negative value. In the specification, a magnitude of the compressive/tensile stress refers to a magnitude of an absolute value regardless of a sign of a value of the compressive/tensile stress.

Referring to FIG. 6, the glass article 100 includes a first compressive region CSR1 extending from the first surface US to a first compressive depth DOC1 and a second compressive region CSR2 extending from the second surface RS to a second compressive depth DOC2. The tensile region CTR is disposed between the first compressive depth DOC1 and the second compressive depth DOC2. The overall stress profile in the glass article 100 may have a relationship in which the regions of both surfaces US and RS are symmetrical to each other with respect to the center in the thickness t direction. Although not illustrated in FIG. 6, compressive and tensile regions may be disposed between opposing side surfaces of the glass article 100 in a similar manner.

The first compressive region CSR1 and the second compressive region CSR2 serve to resist an external shock to prevent the occurrence of cracks in the glass article 100 or damage to the glass article 100. As maximum compressive stresses CS1 and CS2 of the first compressive region CSR1 and the second compressive region CSR2 increase, a strength of the glass article 100 generally increases. Since the external shock is normally transferred through the surfaces of the glass article 100, it is desired in terms of durability to have the maximum compressive stresses CS1 and CS2 on the surfaces of the glass article 100. From such a point of view, the compressive stress of the first compressive region CSR1 and the second compressive region CSR2 is greatest at the surfaces of the glass article and tends to decrease toward the inside of the glass article.

The first compressive depth DOC1 and the second compressive depth DOC2 prevent cracks or grooves formed in the first surface US and the second surface RS from propagating into the tensile region CTR inside the glass article 100. As the first compressive depth DOC1 and the second compressive depth DOC2 become greater, the propagation of the cracks and the like may be better prevented. Points corresponding to the first compressive depth DOC1 and the second compressive depth DOC2 correspond to the boundaries between the compressive regions CSR1 and CSR2 and the tensile region CTR, and have a stress value of 0.

Throughout the glass article 100, the tensile stress of the tensile region CTR may be balanced with the compressive stress of the compressive regions CSR1 and CSR2. That is, the sum (i.e., compressive energy) of the compressive stresses and the sum (i.e., tensile energy) of the tensile stresses in the glass article 100 may be the same as each other. Stress energy accumulated in one region having a constant width in the thickness t direction in the glass article 100 may be calculated as a value obtained by integrating a stress profile. When the stress profile in the glass article 100 having a thickness t is expressed as a function f(x), Equation 1 may be satisfied.

$$\int_0^t f(x)dx = 0 \quad \text{[Equation 1]}$$

As a magnitude of the tensile stress inside the glass article 100 increases, there is a risk that fragments will be more violently released and crushing will occur from the inside of the glass article 100, when the glass article 100 is broken. A maximum tensile stress that satisfies a fragility criterion of the glass article 100 may satisfy Equation 2, but is not limited thereto.

$$CT_1 \leq -38.7 \times \ln(t) + 48.2 \quad \text{[Equation 2]}$$

In some embodiments, a maximum tensile stress CT1 may be about 100 MPa or less, or 85 MPa or less. It may be desired in improving mechanical properties such as a strength that the maximum tensile stress CT1 is about 75 MPa or more. In an embodiment, the maximum tensile stress CT1 may be about 75 MPa or more and about 85 MPa or less, but is not limited thereto.

The maximum tensile stress CT1 of the glass article 100 may be positioned at a central portion of the glass article 100 in the thickness t direction. In an embodiment, for example, the maximum tensile stress CT1 of the glass article 100 may be positioned at a depth in a range of about 0.4 t to about 0.6 t or in a range of about 0.45 t to about 0.55 t or be positioned at a depth of about 0.5 t.

It is desired that the compressive stresses and the compressive depths DOC1 and DOC2 are great to increase a strength of the glass article 100, but as the compressive energy increases, the tensile energy also increases, such that the maximum tensile stress CT1 may also increase. It is desired to adjust the stress profile so that the maximum compressive stresses CS1 and CS2 and the compressive depths DOC1 and DOC2 are great and the compressive energy is small in order to satisfy the fragility criterion while having a high strength. To this end, the glass article 100 may be prepared by a glass composition including specific components in a predetermined amount. According to a composition ratio of the components included in the glass composition, the prepared glass article 100 may have an improved or high strength and, at the same time, may have flexible properties and physical properties to be able to be applied to a foldable display device.

According to an embodiment, the glass composition forming the glass article 100 may include about 60 mole percent (mol %) to about 70 mol % of $SiO_2$, about 5 mol % to about 15 mol % of $Al_2O_3$, about 5 mole % to about 15 mol % of $Na_2O$, about 5 mol % to about 15 mol % of $Li_2O$, about 0 mol % to about 5 mol % of MgO, and about 0 mol % to about 5 mol % of $ZrO_2$ based on the total weight of the glass composition. Here, a "content of any component is about 0 mol %" means that the glass component does not substantially contain the corresponding component. A phrase "glass composition substantially does not contain a specific component" means that the specific composition is not intentionally contained in a raw material or the like, and includes, for example, a case where the glass composition unavoidably contains a trace (e.g., about 0.1 mol % or less) of impurities.

Respective component of the glass composition will be described in more detail below.

$SiO_2$ may serve to constitute a skeleton of the glass, improve chemical durability, and reduce the occurrence of cracks when a scratch (indentation) occurs on a glass surface. $SiO_2$ may be a network former oxide forming a network of the glass, and the glass article 100 prepared to include $SiO_2$ may have a decreased coefficient of thermal expansion and an improved mechanical strength. In order to sufficiently perform the role as described above, a content of $SiO_2$ may be about 60 mol % or more. In order to exhibit sufficient meltability, a content of $SiO_2$ in the glass composition may be about 70 mol % or less.

$Al_2O_3$ serves to improve friability of the glass. In other words, $Al_2O_3$ may serve to allow a smaller number of fragments to occur when the glass breaks. $Al_2O_3$ may be an intermediate oxide forming a bond with $SiO_2$ forming a network structure. In addition, $Al_2O_3$ may act as an active component improving ion exchange performance at the time of chemical strengthening and increasing a surface compressive stress after the chemical strengthening. When a content of $Al_2O_3$ is about 5 mol % or more, $Al_2O_3$ may effectively perform the function as described above. In order to maintain acid resistance and meltability of the glass, it is desired that the content of $Al_2O_3$ is about 15 mol % or less.

$Na_2O$ serves to form a surface compressive stress by ion exchange and improve meltability of the glass. $Na_2O$ may form non-bridging oxygen in a $SiO_2$ network structure by forming an ionic bond with oxygen of $SiO_2$ forming the network structure. An increase in the non-bridging oxygen may improve flexibility of the network structure, and the glass article 100 may have physical properties that it is applicable to the foldable display device. It is desired for effectively performing the role as described above that a content of $Na_2O$ is about 5 mol % or more. However, in terms of acid resistance of the glass article 100, it may be desired that the content of $Na_2O$ is about 15 mol % or less.

$Li_2O$ serves to form a surface compressive stress by ion exchange and improve meltability of the glass, similar to $Na_2O$ described above. $Li_2O$ may form non-bridging oxygen in the $SiO_2$ network structure by forming an ionic bond with oxygen of $SiO_2$ forming the network structure. An increase in the non-bridging oxygen may improve flexibility and a shock absorption function of the network structure, and the glass article 100 may have physical properties that it is applicable to the foldable display device. It is desired for effectively performing the role as described above that a content of $Li_2O$ is 5 mol % or more. However, in terms of heat resistance of the glass article 100, it may be desired that the content of $Li_2O$ is 15 mol % or less.

MgO may improve a surface strength of glass and reduce a formation temperature of the glass. MgO may be a network modifier oxide modifying the $SiO_2$ network structure forming a network structure. MgO may decrease a refractive index of the glass and adjust a coefficient of thermal expansion and an elastic coefficient of the glass. MgO may be omitted (about 0 mol %), but may meaningfully perform the function as described above when a content thereof is about 0.5 is mol % or more. However, in terms of meltability of the glass article 100, it may be desired that the content of MgO is 5 mol % or less.

$ZrO_2$ may improve transmissivity and a surface strength of the glass and increase resistance to surface crack expansion. $ZrO_2$ may be an intermediate oxide forming a bond with $SiO_2$ forming a network structure. $ZrO_2$ is bonded to a portion where a bond is broken by $Li_2O$ and $Na_2O$ in the $SiO_2$ network structure to increase fracture toughness of the glass and increase a repulsive force against bending. $ZrO_2$ may be omitted (about 0 mol %), but may meaningfully perform the function as described above when a content thereof is about 0.5 mol % or more. However, in terms of flexibility of the glass article 100, it may be desired that the content of $ZrO_2$ is 5 mol % or less.

According to an embodiment, the glass composition may satisfy Relation 1 below.

$$0.3<Al_2O_3/(Na_2O+Li_2O)\leq 1 \qquad \text{[Relational Expression 1]}$$

In Relational Expression 1, $Al_2O_3$, $Na_2O$, and $Li_2O$ denote contents (mol %) of respective components.

As described above, the glass article 100 prepared by the glass composition according to an embodiment may have properties and physical properties that it is applicable to the foldable display device. In an embodiment, for example, the glass article 100 may have a flexible property to be able to be folded and unfolded, and may have a strength and chemical properties enough to be able to be applied as the cover window of the display device 500. In a network structure formed by $SiO_2$ and $Al_2O_3$ included in the glass composition, $Na_2O$ and $Li_2O$ are added, such that a network structure having flexibility may be formed. By the addition of $Na_2O$ and $Li_2O$, Na ions or Li ions form ionic bonds with oxygen between bonds forming the network structure, for example, inter-$SiO_2$ bonds, such that the non-bridging oxygen may increase. The increase in the non-bridging oxygen in the network structure means that the bond of the network structure is broken or becomes an open state, and the network structure of the glass may have flexibility. The glass composition may include $Na_2O$ in an amount of about 5 mol % or more and $Li_2O$ in an amount of about 5 mol % or more so that the prepared glass article 100 may have sufficient flexibility.

The glass composition includes relatively excessive amounts of $Na_2O$ and $Li_2O$, and may thus have a low mechanical strength. In such an embodiment, the glass composition includes $Al_2O_3$ to make up for the low mechanical strength, and a ratio of the content of $Al_2O_3$ to the sum of the contents of $Na_2O$ and $Li_2O$ is adjusted in the range of about 0.3 to about 1 according to Relational Expression 1, such that the mechanical strength may be added to the network structure. According to an embodiment, in the glass composition, the ratio of the content of $Al_2O_3$ to the sum of the contents of $Na_2O$ and $Li_2O$ or an R ratio ($=Al_2O_3/(Na_2O+Li_2O)$) may be in the range of about 0.3 to about 1.

As the ratio (R ratio) of the content of $Al_2O_3$ to the sum of the contents of $Na_2O$ and $Li_2O$ included in the glass composition becomes closer to 1, $Al_2O_3$ may have a tetrahedral crystal structure formed by $SiO_2$. In the network structure formed by $SiO_2$, $SiO_2$ may have a tetrahedral crystal structure ($[SiO_4]$), and when the sum of the contents of $Na_2O$ and $Li_2O$ and the content of $Al_2O_3$ are similar to each other, $Al_2O_3$ may also have a tetrahedral crystal structure ([$AlO_4$]). In this case, a content of the non-bridging oxygen formed due to the addition of $Na_2O$ and $Li_2O$ may be decreased, and ion mobility of the glass composition may be increased. The increase in the ion mobility means that an amount of ions moving in a chemical strengthening process in a process of forming the glass article 100 increases and a permeation depth of the ions increases, and a mechanical strength of a surface of the glass article 100 may be improved.

When the ratio (R ratio) of the content of $Al_2O_3$ to the sum of the contents of $Na_2O$ and $Li_2O$ included in the glass composition has a value greater than 0.3, the contents of $Na_2O$ and $Li_2O$ are increased, and the increased $Na_2O$ and $Li_2O$ may break the network structure of $SiO_2$ to increase an interatomic distance in the network structure. Accordingly, a lot of extra space may be formed in the network structure of $SiO_2$, such that shock absorption properties may be improved.

In an embodiment, the ratio (R ratio) of the content of $Al_2O_3$ to the sum of the contents of $Na_2O$ and $Li_2O$ included in the glass composition has a value between 0.3 and 1, such that flexibility of the glass article 100, a strength of the glass article 100 against an external shock, and shock absorption properties of the glass article 100 may be improved.

In an embodiment, the glass composition may include about 66 mol % of $SiO_2$, about 11.7 mol % of $Al_2O_3$, about 9.2 mol % of $Na_2O$, and about 9 mol % of $Li_2O$, and the R ratio according to Relational Expression 1 may be about 0.64.

The glass composition may further include components such as $Y_2O_3$, $La_2O_3$, $Nb_2O_5$, $Ta_2O_5$, and $Gd_2O_3$, if desired, in addition to the components mentioned above. In addition, the glass composition may further include traces of $Sb_2O_3$, $CeO_2$, and/or $As_2O_3$ as clarifiers.

In an embodiment, the glass composition may further include $P_2O_5$ to improve shock absorption properties of the glass. $P_2O_5$ improves ion exchange performance and chipping resistance. $P_2O_5$ may also be a network former oxide forming a network structure together with $SiO_2$. $P_2O_5$ may form a chain structure similar to that of a polymer to have excellent ion mobility, and thus, may absorb a shock while positions of atoms are changed at the time of the shock. $P_2O_5$ may meaningfully perform the function as described above when a content thereof is 0.5 mol % or more. It may be desired that $P_2O_5$ has a content of about 5 mol % or less in terms of chemical resistance of the glass article.

In an embodiment, when the glass composition includes $P_2O_5$, the glass composition may include about 63 mol % of $SiO_2$, about 11.7 mol % of $Al_2O_3$, about 10.6 mol % of $Na_2O$, about 7.5 mol % of $Li_2O$, and about 3 mol % of $P_2O_5$, and the R ratio according to Relational Expression 1 may be about 0.65.

In an embodiment, the glass composition may not include $K_2O$ among $R_2O$ (R=K) other than $Na_2O$ and $Li_2O$ so that ion exchange is smoothly performed in the chemical strengthening process. In the process of forming the glass article 100, the strengthening process in which the ion exchange is performed may be performed only once. The glass composition may not include $K_2O$ so that a large number of Na ions and Li ions may move to the surface of the glass article 100 in the chemical strengthening process. It is desired that the content of $R_2O$, that is, the sum of the contents of $Na_2O$ and the content of $Li_2O$, in the total weight of the glass composition is in the range of about 15 mole % to about 20 mol %.

The glass composition having the above-described composition may be formed into a sheet glass shape by various methods known in the art. When the glass composition is formed into the sheet glass shape, the glass composition in the sheet glass shape may be further processed to be prepared as the glass article 100 applicable to the display device 500. However, the disclosure is not limited thereto, and the glass composition is not formed into the sheet glass shape, and may be directly formed into the glass article 100 applicable to an article without an additional forming process.

Hereinafter, a process in which the glass composition is formed into the sheet glass shape and the glass is processed into the glass article 100 will be described.

Figure 7:
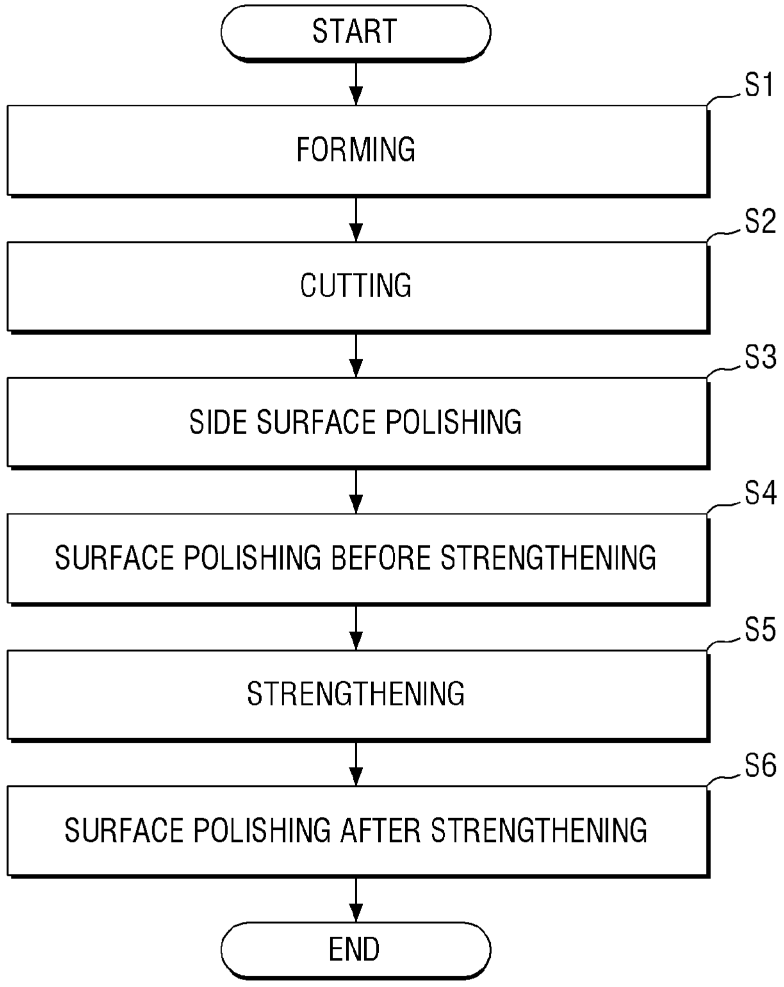
FIG. 7 is a flowchart illustrating a method of preparing the glass article according to an embodiment.
Figure 8:
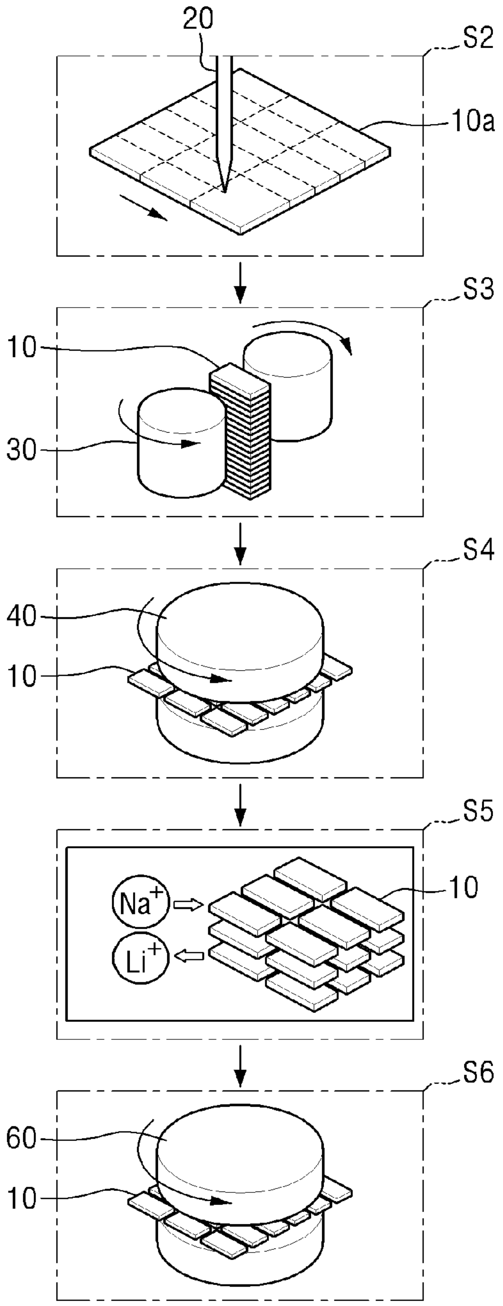
FIG. 8 is a schematic diagram illustrating a cutting process to a surface polishing process after strengthening in FIG. 7.

FIG. 7 is a flowchart illustrating a method of preparing the glass article according to an embodiment. FIG. 8 is a schematic diagram illustrating a cutting process to a surface polishing process after strengthening in FIG. 7.

Referring to FIGS. 7 and 8, an embodiment of a method of preparing the glass article 100 may include a forming process (S1), a cutting process (S2), a side surface polishing process (S3), a surface polishing process before strengthening (S4), a strengthening process (S5), and a surface polishing process after strengthening (S6).

The forming process (S1) may include a process of preparing the glass composition and a process of forming the glass composition. The glass composition may have the composition and the components as described above, and any repetitive detailed description of the glass composition will be omitted. The glass composition may be formed into the sheet glass shape by a method such as a float process, a fusion draw process, or a slot draw process.

A glass formed into a flat panel plate shape may be cut through the cutting process (S2). The glass formed into the flat panel plate shape may have a size different from that applied to a final glass article 100. In an embodiment, for example, glass forming may be performed in a state of a large-area substrate as a mother glass substrate 10*a* including a plurality of glass articles, and the mother glass substrate 10*a* may be cut into a plurality of cells 10 to prepare the plurality of glass articles. In an embodiment, for example, where the final glass article 100 has a size of about 6 inches, the glass may be formed in a size several to hundreds of times the size of the final glass article 100, for example, 120 inches, and then cut, twenty glasses formed in the flat panel plate shape may be obtained at once. In this case, process efficiency may be improved as compared with a case of separately forming individual glass articles. In addition, even though a glass corresponding to a size of one glass article is formed, when the final glass article has various planar shapes, the glass may be prepared in a desired shape through a cutting process.

The cutting of the mother glass substrate 10*a* may be performed using a cutting knife 20, a cutting wheel, a laser beam, or the like, as shown in FIG. 8.

The cutting process (S2) of the glass may be performed before the strengthening process (S5) of the glass. The glass 10*a* in a mother substrate unit may be strengthened at once and then cut to a size of the final glass article, but in this case, cut surfaces (e.g., side surfaces of the glass) may be in a non-strengthened state, and thus, it may be desired to first complete the cutting of the glass and then perform the strengthening process (S5).

A polishing process before strengthening may be performed between the cutting process (S2) of the glass and the strengthening process (S5) of the glass. The polishing process may include the side surface polishing process (S3) and the surface polishing process before strengthening (S4). In an embodiment, the side surface polishing process (S3) is first performed and the surface polishing process before strengthening (S4) is then performed, but this order may also be changed.

The side surface polishing process (S3) is a process of polishing side surfaces of the cut glass 10. In the side surface polishing process (S3), the side surfaces of the glass 10 are polished to allow the side surfaces of the glass 10 to have smooth surfaces. In addition, the respective side surfaces of the glass 10 may have uniform surfaces through the side surface polishing process (S3). More specifically, the cut glass 10 may include one or more cut surfaces. Two of four side surfaces of some cut glasses 10 may be cut surfaces. Three of four side surfaces of some other cut glasses 10 may be cut surfaces.

All of four side surfaces of some other cut glasses 10 may be cut surfaces. Surface roughnesses or the like may be different from each other when the side surface is a cut surface and when the side surface is an uncut surface. In addition, the cut surfaces may have different surface roughnesses from each other. Accordingly, by polishing the respective side surfaces through the side surface polishing process (S3), the respective side surfaces may have a uniform surface roughness or the like. Furthermore, when there is a small crack on the side surface, the small crack may be removed through the side surface polishing process (S3).

The side surface polishing process (S3) may be performed simultaneously on a plurality of cut glasses 10. In an embodiment, in a state in which the plurality of cut glasses 10 are stacked one on another, the stacked glasses 10 may be polished simultaneously.

The side surface polishing process (S3) may be performed by a mechanical polishing method or a chemical mechanical polishing method using a polishing device 30 as shown in FIG. 8. In an embodiment, two opposing side surfaces of the cut glasses 10 may be polished simultaneously, and then, the other two opposing side surfaces of the cut glasses 10 may be polished simultaneously, but the disclosure is not limited thereto.

The surface polishing process before strengthening (S4) may be performed to allow each glass 10 to have a uniform surface. The surface polishing process before strengthening (S4) may be performed for each cut glass 10, but when a chemical mechanical polishing device 40 is sufficiently greater than the glass 10, a plurality of glasses 10 may be horizontally arranged, and surfaces of the plurality of glasses 10 may then be polished simultaneously.

The surface polishing process before strengthening (S4) may be performed by a chemical mechanical polishing method. Specifically, a first surface and a second surface of the cut glass 10 are polished using the chemical mechanical polishing device 40 and a polishing slurry as shown in FIG. 8. The first surface and the second surface may be polished simultaneously, or one of the first surface and the second surface may be first polished and the other of the first surface and the second surface may then be polished.

After the surface polishing process before strengthening (S4), the strengthening process (S5) is performed as shown in FIG. 8. The strengthening process (S5) may be performed by chemical strengthening and/or thermal strengthening. When the glass 10 has a small thickness of about 2 millimeters (mm) or less, and furthermore, about 0.75 mm or less, a chemical strengthening method may be suitably applied to precisely control a stress profile.

After the strengthening process (S5), the surface polishing process after strengthening (S6) may be optionally further performed. The surface polishing process after strengthening (S6) may serve to remove fine cracks on the surface of the strengthened glass 10 and control compressive stresses of the first surface and the second surface of the strengthened glass 10. In an embodiment, for example, a floating method, which is one of methods of preparing a sheet glass, is performed in a manner of pouring a glass composition into a tin bath, in this case, a surface in contact with the tin bath and a surface that is not in contact with the tin bath may have different compositions. Accordingly, after the strengthening process (S5) of the glass 10, a deviation of a compressive stress between the surface in contact with the tin bath and a surface that is not in contact with the tin bath may occur, but by removing the surface of the glass 10 to an appropriate thickness by polishing, the deviation of the compressive stress between the surface in contact with the tin bath and a surface that is not in contact with the tin bath may be decreased.

The surface polishing process after strengthening (S6) may be performed by a chemical mechanical polishing method. Specifically, a first surface and a second surface of the strengthened glass 10, which is a glass 10 to be processed, are polished using the chemical mechanical polishing device 60 and a polishing slurry as shown in FIG. 8. A polishing thickness may be adjusted, for example, in the range of 100 nm to 1000 nm, but is not limited thereto. Polishing thicknesses of the first surface and the second surface may be the same as each other or be different from each other.

Although not illustrated in FIGS. 7 and 8, a shape processing process may be further performed, if desired, after the surface polishing process after strengthening (S6). In an embodiment, for example, when the glass articles 101 to 103 having the three-dimensional shape illustrated in FIG. 1 are prepared, a three-dimensional processing process may be performed after the surface polishing process after strengthening (S6) is completed.

The glass article 100 prepared through the above-described process may have a component ratio similar to that of the glass composition. In an embodiment, for example, the glass article 100 may include about 60 mol % to about 70 mol % of $SiO_2$, about 5 mol % to about 15 mol % of $Al_2O_3$, about 5 mol % to about 15 mol % of $Na_2O$, about 5 mol % to about 15 mol % of $Li_2O$, about 0 mol % to about 5 mol % of MgO, and about 0 mol % to about 5 mol % of $ZrO_2$. In addition, a glass article 100 according to another embodiment may include $P_2O_5$ in an amount of about 0 mol % to about 5 mol % in addition to the above-described component ratio. The glass composition for preparing the glass article 100 may satisfy Relational Expression 1.

$$0.3<Al_2O_3/(Na_2O+Li_2O)\leq 1 \quad \text{[Relational Expression 1]}$$

In Relational Expression 1, $Al_2O_3$, $Na_2O$, and $Li_2O$ denote contents (mol %) of respective components.

In addition, the glass article 100 according to an embodiment may not include $R_2O$ (R=K) other than $Na_2O$ and $Li_2O$, for example, $K_2O$.

According to an embodiment, the glass article 100 may have an etch rate for an etchant in a range of about 1 micrometer per minute (μm/min) to about 4 μm/min. The glass article 100 may have flexibility and a strength to be able to be applied to the display device 500, for example, the foldable display device 500, and may have physical properties that it is easily formed, if desired. As described above, the glass article 100 prepared by the glass composition including $Na_2O$ and $Li_2O$ may have a mechanical strength enough to be able to be applied to the foldable display device

500. In addition, the glass article 100 may have improved shock absorption properties by including $Li_2O$, and may have improved surface scratch resistance and crack expansion resistance by including $ZrO_2$. In addition, since the glass article 100 has a good etch rate for the etchant, a process time required for forming the glass article 100 may be decreased, and surface damage due to the forming of the glass article 100 may hardly occur.

According to an embodiment, the glass article 100 may have an etch rate for an etchant in the range of about 1 μm/min to about 4 μm/min. In an embodiment, for example, the etchant that may be used for forming the glass article 100 may include a fluorine-based etchant. In an embodiment, for example, the etchant may be one selected from a hydrogen fluoride (HF)-based etchant, an acidic ammonium fluoride ($NH_4HF_2$)-based etchant, and an ammonium bifluoride ($NH_4F_2$)-based etchant. In addition, in some embodiments, the etchant may further include hydrochloric acid (HCl), sulfuric acid ($H_2SO_4$), nitroxyl (HNO), ultrapure water, and the like, as additives to the fluorine-based etchant.

According to an embodiment, the glass article 100 prepared from the above-described glass composition may have a thickness in a range of about 20 μm to about 100 μm, and satisfy the following physical properties.

i) Glass transition temperature ($T_g$): 500° C. to 700° C.
ii) Density: 2.3 g/cm$^3$ to 2.6 g/cm$^3$
iii) Elastic modulus: 75 GPa to 85 GPa
iv) Hardness: 6.0 GPa to 7.0 GPa
v) Fracture toughness: 1.0 MPa·m$^{0.5}$ to 1.5 MPa·m°.
vi) Brittleness: 4.5 μm$^{-0.5}$ to 6 μm$^{-0.5}$
vii) Coefficient of thermal expansion ($10^{-7}$ K$^{-1}$): 70×10$^7$ K$^{-1}$ to 85×10$^7$ K$^{-1}$
viii) Poisson ratio: 0.18 to 0.22

Hereinafter, more specific contents of Example will be described with reference to Preparation Examples and Experimental Examples.

Preparation Example 1: Preparation of Glass Article

A plurality of glass base materials having various compositions were prepared according to Table 1 and were divided into SAMPLE #1, SAMPLE #2, SAMPLE #3, SAMPLE #4, SAMPLE #5, and SAMPLE #6, and a glass article preparing process according to the method described above was then performed for each sample. Glass articles for each sample were prepared as articles having a thickness of about 50 μm.

Compositions of glass articles for each sample were shown in Table 1. In addition, densities, glass transition temperatures, hardnesses, fracture toughnesses, brittlenesses, elastic moduli, coefficients of thermal expansion, and Poisson ratios of the glass articles for each sample were measured and shown in Table 2.

Here, specimens having 5 g of each composition were manufactured, and glass transition temperatures (Tg) of the specimens were confirmed using a differential thermal analyzer (DTA) while raising temperatures of the specimens to a glass transition temperature range at a rate of 10 K/min. Specimens having a size of 10×10×13 mm$^3$ were manufactured for each composition, and coefficients of thermal expansion of the specimens were confirmed using a thermal mechanical analyzer (TMA) while raising temperatures of the specimens to a glass transition temperature range at a rate of 10 K/min.

Specimens having a size of 10×20×3 mm$^3$ were manufactured for each composition, and elastic moduli and Poisson ratios of the specimens were confirmed using an elastic modulus tester by confirming stresses and strains of the specimens.

$$H_v = 1.854 \cdot \frac{F}{a^2} \tag{3}$$

Hardnesses and fracture toughnesses of specimens were calculated by Equations (3) and (4) by applying a load of 4.9 N to the specimens for 30 seconds with a Vickers hardness tester using a diamond tip having a size of 19 μm.

$$\frac{K_{IC} \cdot \phi}{H_V \cdot a^{\frac{1}{2}}} = 0.15 \cdot K \cdot \left(\frac{c}{a}\right)^{-\frac{3}{2}} \tag{4}$$

Here, HV refers to a Vickers hardness, F refers to a load, and a refers to an indentation length.

Here, KIC refers to a fracture toughness, ϕ refers to a constraint index (ϕ≈3), HV refers to a Vickers hardness, K refers to a constant (=3.2), c refers to a crack length, and a refers to an indentation length.

Brittlenesses of specimens were calculated by Equation (5) by applying a load of $$B = \gamma P^{-1/4}\left(\frac{C}{a}\right)^{3/2} \tag{5}$$

30 seconds using a Vickers hardness tester.

Here, B refers to a brittleness, γ, refers to a constant (2.39 N$^{1/4}$/um$^2$), P refers to an indentation load, a refers to an indentation length, and C refers to a crack length.

TABLE 1

| Sample Group | | SAMPLE#1 | SAMPLE#2 | SAMPLE#3 | SAMPLE#4 | SAMPLE#5 | SAMPLE#6 |
|---|---|---|---|---|---|---|---|
| Composition | $SiO_2$ | 66.0 | 66.0 | 63.0 | 70.0 | 68.9 | 67.1 |
| | $Al_2O_3$ | 11.7 | 12.7 | 11.7 | 7.7 | 10.3 | 11.3 |
| | $B_2O_3$ | — | | — | — | — | 0.4 |
| | MgO | 3.1 | 3.1 | 3.1 | 7.5 | 5.4 | 4.7 |
| | $P_2O_5$ | — | | 3.0 | — | — | — |
| | $Na_2O$ | 9.2 | 10.1 | 10.6 | 12.7 | 15.2 | 14.8 |
| | $K_2O$ | — | | — | 1.7 | — | 1.4 |
| | $Li_2O$ | 9.0 | 7.0 | 7.5 | — | — | — |
| | $ZrO_2$ | 1.0 | 1.0 | 1.0 | — | — | — |

TABLE 1-continued

| Sample Group | SAMPLE#1 | SAMPLE#2 | SAMPLE#3 | SAMPLE#4 | SAMPLE#5 | SAMPLE#6 |
|---|---|---|---|---|---|---|
| Composition Ratio (mol %) $Al_2O_3$:$R_2O$ | 11.7:18.2 | 12.7:17.1 | 11.7:18.1 | 7.7:14.4 | 10.3:15.2 | 11.3:16.2 |
| Composition Ratio (mol %) $Al_2O_3/R_2O$ | 0.64 | 0.76 | 0.65 | 0.53 | 0.68 | 0.70 |

TABLE 2

| | | | | | | | |
|---|---|---|---|---|---|---|---|
| Physical Property | Density (g/cm$^3$) | 2.464 | 2.446 | 2.449 | 2.46 | 2.42 | 2.45 |
| | Glass Transition Temperature Tg (° C.) | 581 | 610 | 700 | 602 | 599 | 560 |
| | Hardness (GPa) | 6.678 | 6.531 | 6.531 | 6.05 | 5.24 | 5.79 |
| | Fracture Toughness (MPa · m$^{0.5}$) | 1.27 | 1.29 | 1.32 | 0.70 | 0.68 | 0.67 |
| | Brittleness (μm$^{-0.5}$) | 5.82 | 5.08 | 4.99 | 8.64 | 7.71 | 8.64 |
| | Elastic Modulus (GPa) | 85 | 79 | 79 | 74 | 71.5 | 70 |
| | Coefficient of Thermal Expansion ($10^{-7}$ K$^{-1}$) | 84.0 | 74.0 | 84.0 | 88.0 | 80.0 | 91.0 |
| | Poisson ratio | 0.213 | 0.202 | 0.202 | 0.220 | 0.210 | 0.200 |

Referring to Tables 1 and 2, SAMPLE #1 and SAMPLE #2 are glass articles made of glass compositions including $Li_2O$ and $ZrO_2$, respectively, and SAMPLE #3 is a glass article made of a glass composition including $Li_2O$, $ZrO_2$, and $P_2O_5$. In addition, SAMPLE #4, SAMPLE #5, and SAMPLE #6 are glass articles made of glass compositions that do not contain $Li_2O$, $ZrO_2$, and $P_2O_5$, respectively.

It can be seen that SAMPLE #1, SAMPLE #2, and SAMPLE #3 have a high hardness of 6.5 GPa or more and a high elastic modulus of 79 or more, as compared with SAMPLE #4, SAMPLE #5, and SAMPLE #6. It may mean that flexibility as well as strength is excellent. On the other hand, it can be seen that SAMPLE #4, SAMPLE #5, and SAMPLE #6 have a relatively low hardness of 6.1 GPa or less and a relatively low elastic modulus of 74 or less. Therefore, it can be seen that SAMPLE #4, SAMPLE #5, and SAMPLE #6 have a relatively low strength and flexibility.

In addition, it could be seen that fracture toughnesses of SAMPLE #1, SAMPLE #2, and SAMPLE #3 are 1.27 MPa·m$^{0o}$ 5, 1.29 MPa·m$^{0o}$ 5, and 1.32 MPa·m$^{0o}$, respectively, and brittlenesses of SAMPLE #1, SAMPLE #2, and SAMPLE #3 are 5.82 μm$^{-0.5}$, 5.08 μm$^{-0.5}$, and 4.99 μm$^{0.5}$, respectively. On the other hand, fracture toughnesses of SAMPLE #4, SAMPLE #5, and SAMPLE #6 are 0.7 MPa·m$^{0.5}$ or less and brittlenesses of SAMPLE #4, SAMPLE #5, and SAMPLE #6 are 7.7 μm$^{0.5}$ or more, and accordingly, it can be seen that SAMPLE #1, SAMPLE #2, and SAMPLE #3 have excellent shock resistance properties as compared with other samples.

Experimental Example 1: Evaluation of Shock Resistance Properties—Pen Drop (Pen Diameter: 0.77 r) Evaluation A pen drop test (PDT) was performed on SAMPLE #1, SAMPLE #2, and SAMPLE #4 of samples in Table 1. The pen drop test was performed in a manner of dropping a pen having a diameter of 0.7 π on a surface of a sample article that is fixed and confirming a height at which cracks occur in the surface of the sample article. A drop height of the pen was moved by 0.1 cm, and the pen drop test was performed in the range of 0.5 cm to 10 cm. When the drop of the pen was repeated and cracks finally occurred, a height just before the cracks (that is, a maximum height at which the crack did not occur) was determined as a limit drop height. Results of the pen drop test were illustrated in FIG. 9. In particular, in SAMPLE #1, sample articles were prepared while changing a time of a strengthening process in preparing a glass to 20 minutes, 40 minutes, 60 minutes, and 80 minutes, respectively, and a pen drop test was then performed on the sample articles, and in Sample #2, a strengthening process was performed for 20 minutes, and a pen drop test was then performed on the sample articles.

Figure 9:
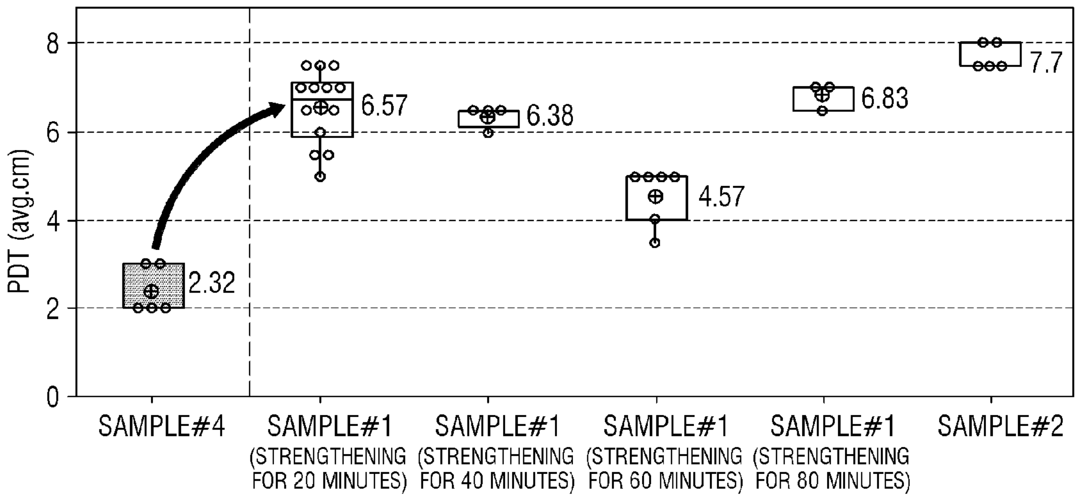
FIG. 9 is a graph illustrating results of a pen drop test for evaluating shock resistance properties of glass articles according to an embodiment.

FIG. 9 is a graph illustrating results of a pen drop test for evaluating shock resistance properties of glass articles according to an embodiment.

Referring to FIG. 9, an average value of limit drop heights of SAMPLE #4 was measured to be 2.32 cm. On the other hand, in the case of SAMPLE #1, when the time of the strengthening process was changed to 20 minutes, 40 minutes, 60 minutes, and 80 minutes, respectively, average values of limit drop heights were measured to be 6.57 cm, 6.38 cm, 4.57 cm, and 6.83 cm. In a case of SAMPLE #2, an average value of limit drop heights was measured to be 7.7 cm Therefore, it can be seen that SAMPLE #1 and SAMPLE #2 exhibit the average value of the limit drop height substantially higher than that of SAMPLE #4 in the pen drop test and has an improved surface strength. As a result of the pen drop test using a pen having a diameter of 0.77 r, the glass article 100 according to an embodiment may have an average value of the limit drop height of 4.5 cm or more.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A glass article having a glass composition comprising 60 mol % to 70 mol % of $SiO_2$, 5 mol % to 15 mol % of $Al_2O_3$, 5 mol % to 15 mol % of $Na_2O$, 11.5 mol % to 15 mol % of $Li_2O$, 0.5 mol % to 5 mol % of MgO, 0 mol % to 5 mol % of $ZrO_2$, and about 0.5 mol % to about 5 mol % of $P_2O_5$ based on a total weight of the glass composition, wherein a thickness of the glass article is in a range of about 20 μm to about 100 μm, and wherein the glass composition satisfies the following Relational Expression 1:

$$0.3<Al_2O_3/(Na_2O+Li_2O)\leq 1,$$

in which $Al_2O_3$, $Na_2O$, and $Li_2O$ denote contents (mol %) of respective components in the glass composition.

2. The glass article of claim 1, wherein an etch rate of the glass article for a fluorine-based etchant is in a range of about 1 μm/min to about 4 μm/min.

3. The glass article of claim 1, wherein a glass transition temperature of the glass article is in a range of about 500° C. to about 700° C.

4. The glass article of claim 1, wherein a density of the glass article is in a range of about 2.3 g/cm$^3$ to about 2.6 g/cm$^3$.

5. The glass article of claim 1, wherein an elastic modulus of the glass article is in a range of about 75 GPa to about 85 GPa.

6. The glass article of claim 1, wherein a hardness of the glass article is in a range of about 6.0 GPa to about 7.0 GPa.

7. The glass article of claim 1, wherein a fracture toughness of the glass article is in a range of about 1.0 MPa·m$^{0.5}$ to about 1.5 MPa·m$^{0.5}$.

8. The glass article of claim 1, wherein a brittleness of the glass article is in a range of about 4.5 μm$^{-0.5}$ to about 6 μm$^{-0.5}$.

9. The glass article of claim 1, wherein a coefficient of thermal expansion of the glass article is in a range of about $70\times10^{-7}K^{-1}$ to about $85\times10^{-7}K^{-1}$.

10. The glass article of claim 1, wherein a Poisson ratio of the glass article is in a range of about 0.18 to about 0.22.

11. The glass article of claim 1, wherein an average value of limit drop heights of pen drop damage is about 4.5 cm or more.

12. A glass composition comprising: about 60 to about 70 mol % of $SiO_2$, about 5 mol % to about 15 mol % of $Al_2O_3$, about 5 mol % to about 15 mol % of $Na_2O$, about 11.5 mol % to about 15 mol % of $Li_2O$, about 0.5 mol % to about 5 mol % of MgO, about 0 mol % to about 5 mol % of $ZrO_2$, and about 0.5 mol % to about 5 mol % of $P_2O_5$ based on a total weight of the glass composition, wherein the glass composition satisfies the following Relational Expression:

$$0.3<Al_2O_3/(Na_2O+Li_2O)\leq 1,$$

in which $Al_2O_3$, $Na_2O$, and $Li_2O$ denote contents (mol %) of respective components in the glass composition.

13. The glass composition of claim 12, wherein the glass composition does not comprise $R_2O$ (R=K) other than $Na_2O$ and $Li_2O$.

14. A display device comprising:

a display panel including a plurality of pixels;

a cover window disposed above the display panel; and an optical clear coupling layer disposed between the display panel and the cover window, wherein the cover window has a glass composition comprising about 60 mol % to about 70 mol % of $SiO_2$, about 5 mol % to about 15 mol % of $Al_2O_3$, about 5 mol % to about 15 mol % of $Na_2O$, about 11.5 mol % to about 15 mol % of $Li_2O$, about 0.5 mol % to about 5 mol % of MgO, about 0 mol % to about 5 mol % of $ZrO_2$, and about 0.5 mol % to about 5 mol % of $P_2O_5$ based on a total weight of the glass composition, and the cover window has a thickness in a range of about 20 μm to about 100 μm, the glass composition of the cover window satisfies Relational Expression:

$$0.3<Al_2O_3/(Na_2O+Li_2O)\leq 1,$$

in which $Al_2O_3$, $Na_2O$, and $Li_2O$ denote contents (mol %) of respective components in the glass composition.

15. The display device of claim 14, wherein the cover window does not comprise $R_2O$ (R=K) other than $Na_2O$ and $Li_2O$.

16. The display device of claim 14, wherein a glass transition temperature of the cover window is in a range of about 500° C. to about 700° C.

17. The display device of claim 14, wherein a density of the cover window is in a range of about 2.3 g/cm$^3$ to about 2.6 g/cm$^3$.

18. The display device of claim 14, wherein an elastic modulus of the cover window is in a range of about 75 GPa to about 85 GPa.

19. The display device of claim 14, wherein a hardness of the cover window is in a range of about 6.0 GPa to about 7.0 GPa.

20. The display device of claim 14, wherein a fracture toughness of the cover window is in a range of about 1.0 MPa·m$^{0.5}$ to about 1.5 MPa·m$^{0.5}$.

21. The display device of claim 14, wherein a brittleness of the cover window is in a range of about 4.5 m$^{-0.5}$ to about 6 m$^{-0.5}$.

22. The display device of claim 14, wherein a coefficient of thermal expansion of the cover window is in a range of about $70\times10^{-7}K^{-1}$ to about $85\times10^{-7}K^{-1}$.

23. The display device of claim 14, wherein a Poisson ratio of the cover window is in a range of about 0.18 to about 0.22.

* * * * *